United States Patent [19]

Donhauser et al.

[11] Patent Number: 5,541,810
[45] Date of Patent: Jul. 30, 1996

[54] EXPANDABLE PROGRAMMABLE CONTROLLER

[75] Inventors: Peter Donhauser; Richard Gmeiner, both of Amberg, Germany

[73] Assignee: Siemens Aktiengesellschaft, München, Germany

[21] Appl. No.: 836,129

[22] Filed: Feb. 14, 1992

[30] Foreign Application Priority Data

Feb. 22, 1991 [EP] European Pat. Off. ............ 91102583

[51] Int. Cl.$^6$ ................... G06F 1/16; H05K 5/00
[52] U.S. Cl. ................... 361/686; 361/731; 361/733; 439/928.1
[58] Field of Search ................... 439/928, 716, 439/928.1; 361/380, 392, 393, 394, 395, 686, 731, 733, 822, 823; 364/708.1

[56] References Cited

U.S. PATENT DOCUMENTS

| | | | |
|---|---|---|---|
| 4,246,436 | 1/1981 | Hoffman et al. | 361/427 X |
| 4,378,502 | 3/1983 | Clarke | 361/397 X |
| 4,738,632 | 4/1988 | Schmidt et al. | 361/393 X |
| 4,790,762 | 12/1988 | Harms et al. | 439/59 |
| 4,920,453 | 4/1990 | Onose et al. | 361/392 |
| 5,000,692 | 3/1991 | Taniguchi et al. | 439/928 X |

FOREIGN PATENT DOCUMENTS

| | | |
|---|---|---|
| 3603750 | 8/1987 | Germany. |
| 3629566 | 3/1988 | Germany. |
| 3932005 | 4/1990 | Germany. |

*Primary Examiner*—Michael W. Phillips
*Attorney, Agent, or Firm*—Kenyon & Kenyon

[57] ABSTRACT

An expandable automation system includes both a programmable controller that is capable of stand-alone operation, and a modular programmable controller. The programmable controller that is capable of standalone operation has an interface, such as a multipole plug connector, for connecting expansion units. The modular programmable controller consists of a central processing unit and expansion modules. The expansion modules of the modular programmable controller can be used as expansion units for the programmable controller that is capable of standalone operation.

12 Claims, 8 Drawing Sheets

EXPANDABLE PROGRAMMABLE CONTROLLER

BACKGROUND OF THE INVENTION

The present invention relates generally to automation systems, and more particularly to an expandable automation system. Automation systems on the market today can be divided into two groups, namely programmable controllers of a modular construction and programmable controllers capable of autonomous or stand-alone operation. The latter can be expanded by connecting peripheral equipment. Both types of programmable controllers, however, have disadvantages specific to their group.

Programmable controllers that are capable of stand-alone operation, so-called compact units, are in fact relatively inexpensive when first installed. However, when the level of automation is increased later on, they reach their limits very quickly, with respect to the compact unit's expanding capability as well as its computing power. Therefore, when later expansion is required, the entire programmable controller often has be replaced by a programmable controller with a modular design.

Modular automation systems, such as that disclosed by German Published Patent Application 36 03 750, avoid these disadvantages. However their minimal configuration, consisting of a central processing unit and a few expansion modules, is often considerably more expensive than a compact unit.

The present invention is directed to the problem of developing an automation system, which is suited both for small automation tasks as well as for larger automation tasks and which can be adapted at any time to modified requirements resulting from future expansion.

SUMMARY OF THE INVENTION

The present invention solves this problem by providing an automation system which includes a programmable controller and a modular programmable controller. The programmable controller is capable of stand-alone operation and has an interface, such as a multipole plug connector for connecting expansion units. The modular programmable controller includes a central processing unit and expansion modules. The expansion modules can be used as expansion units for the programmable controller that is capable of stand-alone operation.

In this manner, only a very inexpensive compact unit needs to be employed initially. When the programmable controller is later expanded, modules of the modular programmable controller are connected to the compact unit. If, for example, greater computing power is needed during the third expansion, the compact unit is then replaced by the central processing unit of the modular programmable controller.

When the expansion modules are connected to the programmable controller that is capable of stand-alone operation via an interface module, it is possible to develop the stand-alone programmable controller and the modular programmable controller independently of one another, since the interface module adapts the interface.

When the interface module has connections for supplying power to the interface module and the expansion module, a stand-alone programmable controller can be manufactured which is especially small and even more cost-effective. Such a stand-along programmable controller is feasible because the compact unit's power supply device only has to be designed to be large enough to supply current to the compact unit.

When the interface module has a mating interface, for example a socket, which corresponds to the interface and is connected via a multicore flexible cable, preferably a ribbon cable, to the interface module, the interface of the compact unit can be rigidly attached to the compact unit. This allows the interface to have an especially simple design and also avoids problems associated with storing the interface in stand-alone operation.

DETAILED DESCRIPTION

Figure 1:
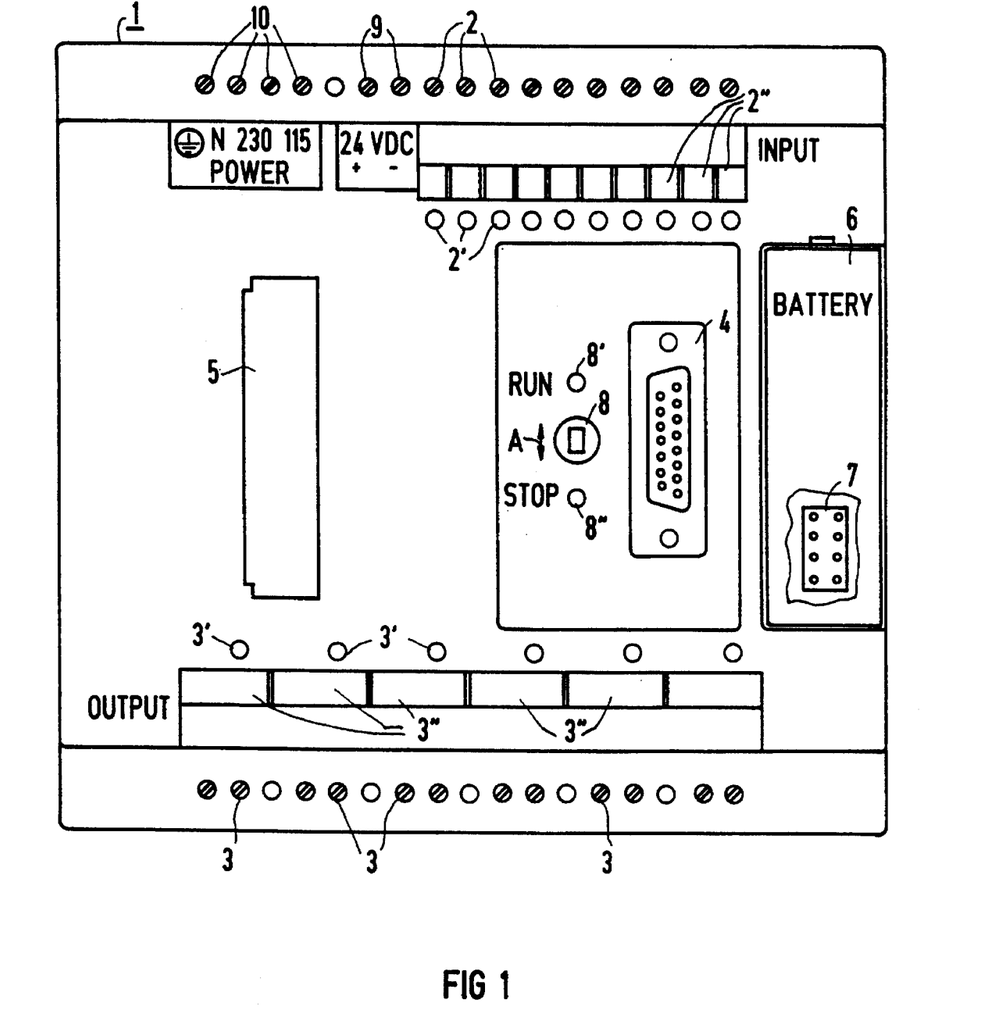
FIG. 1 depicts the front side of a stand-alone programmable controller.

Referring to FIG. 1, a programmable controller 1 has screw-type terminals 2 and 3 for connecting external wiring of leads for input or output signals. LED displays 2' and 3' are allocated to the screw-type terminals 2 and 3, respectively. Furthermore, the programmable controller 1 has a SUB-D clamp-type terminal 4, to which a programming unit can be connected, as well as a module slot 5 for inserting a user module, a battery compartment 6 and a multicore plug connector 7 for connecting expansion units 14 via an interface module 22 (shown in FIG. 3). The user can start or stop the program of the programmable controller 1 with the switch 8, which moves in the direction of the double arrow A. The circuit state of the unit 1 is indicated by the displays 8' and 8".

Labelling fields 2", 3" are assigned to the LED displays 2', 3', so that, with one glance one can recognize which indication is attributed to which connection 2 and 3 or tile assigned LED display 2' and 3'. As is furthermore apparent from FIG. 1, the programmable controller 1 has a screw-terminal pair 9, through which, for example, signal transmitters (not depicted) can be supplied with a direct voltage of 24 V. The programmable controller 1 itself is suitable for connection via tile screw-type terminal quartet 10 to an AC voltage supply system of 115 or 230 volts.

Figure 2:
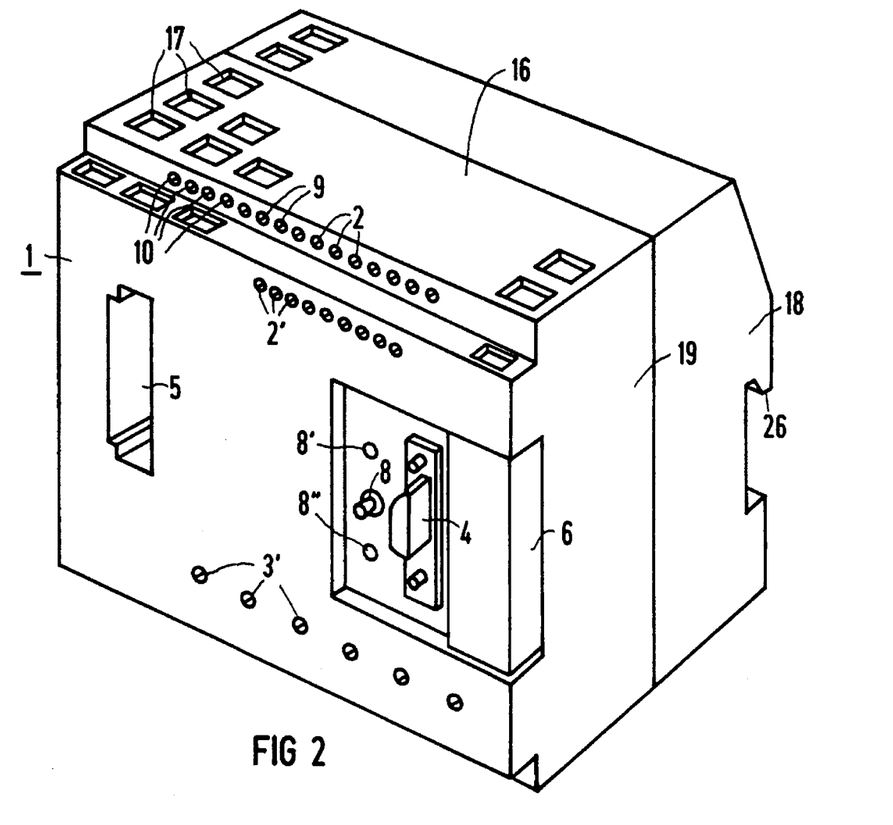
FIG. 2 depicts a perspective view of the programmable controller.

According to FIG. 2, the projection 26 of the stand-alone programmable controller 1 can be used to secure it to a standard top-hat rail (not depicted). After the unit 1 is swivelled, a spring-loaded locking bar (not shown) latches with the top-hat rail, so that the unit 1 is tightly, but detachably connected to the top-hat rail.

FIG. 2 also shows that on the top side 16 (as well as the bottom side, which is not visible), the programmable controller 1 has venting grids 17 to remove the heat loss that occurs in the programmable controller 1. The casing of the programmable controller 1 also includes a base portion 18 and a protective cover 19.

Figure 3:
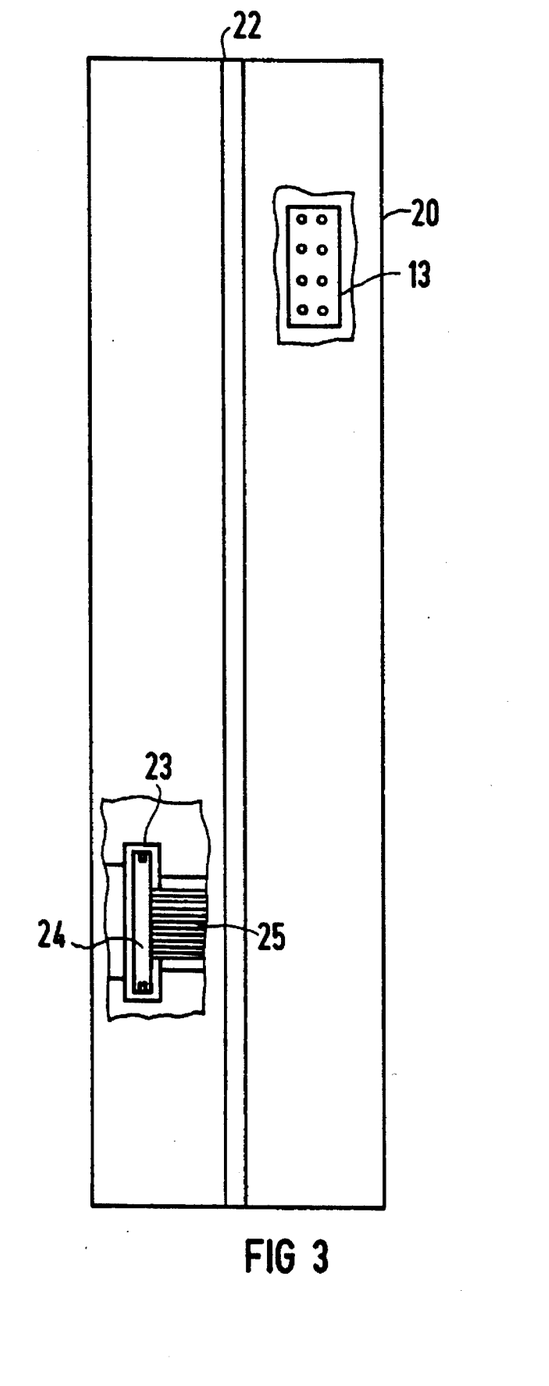
FIG. 3 depicts a partial cut-away view of the interface module.

According to FIG. 3, an interface module 22 has a pocket 23, in which the plug socket 24 is retained before being connected to the plug connector 7 of the programmable controller 1. The socket 24 is connected via the ribbon cable 25 to a printed-circuit board (not depicted in FIG. 4) of the interface module 22. Furthermore, the interface module 22 exhibits a multipole plug connector 13, which is likewise connected to the printed-circuit board of the interface module 22. In the same way as the programmable controller 1, the interface module 22 can be snapped on to a mounting rail, such as a standard top-hat rail. The plug connector 13 is very easily accessible when it is arranged in the side wall 20 of the interface module 22.

Figure 6:
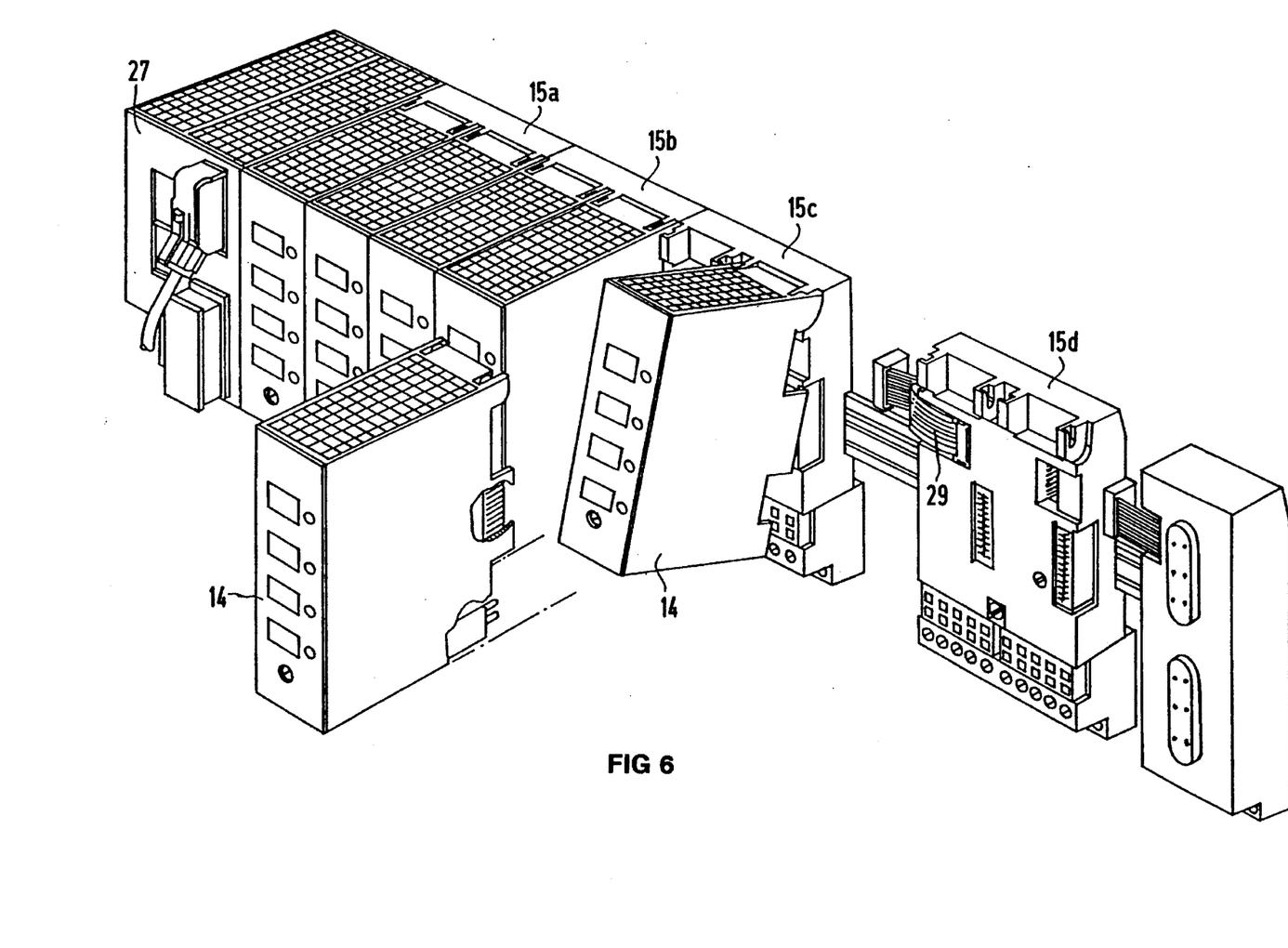
FIG. 6 shows a perspective view of a modular programmable controller.

To connect expansion units 14 to the programmable controller 1, the interface module 22 is snapped on to the above-mentioned mounting rail, next to the programmable controller 1. The socket 24 is taken out of the pocket 23 and connected to the plug connector 7 of the programmable controller 1 (see FIG 4A). The expansion units 14 themselves can be connected via a plug-in connection to the plug connector 13 of the interface module 22. The expansion units 14 are thereby the modules of a modular programmable controller, as sold for example by Siemens AG under the model designation SIMATIC S5-100 (see FIG. 6) and as described inter alia in the German Published Patent Application 36 03 750. According to FIG. 6, this programmable controller includes a central processing unit and expansion modules 14. The individual mounting racks 15a, 15b, 15c and 15d are snapped side-by-side on to a standard top-hat rail and each connected via a ribbon cable 2d to the neighboring rack.

Figures 4, 4A:
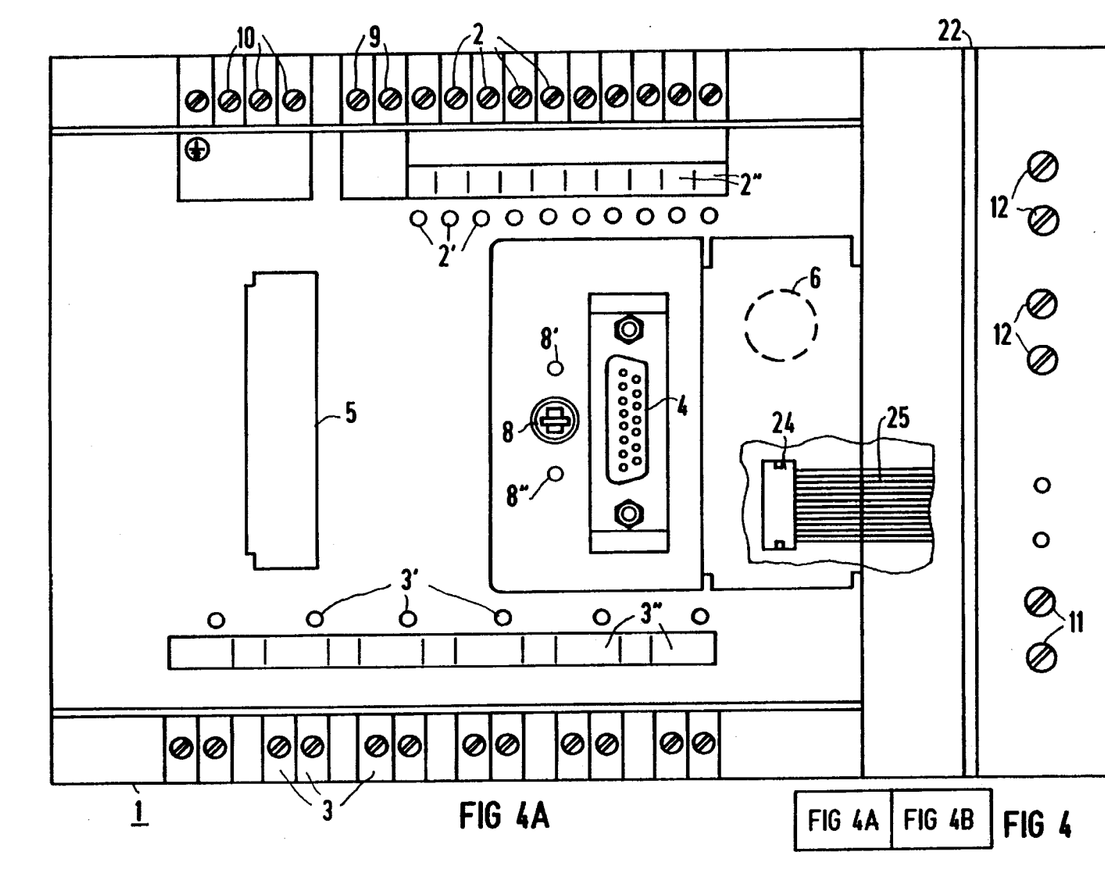
FIG. 4 depicts the layout of FIGS. 4A and 4B.
FIGS. 4A and 4B depict the front view of the programmable controller with an expansion unit.
Figure 4B:
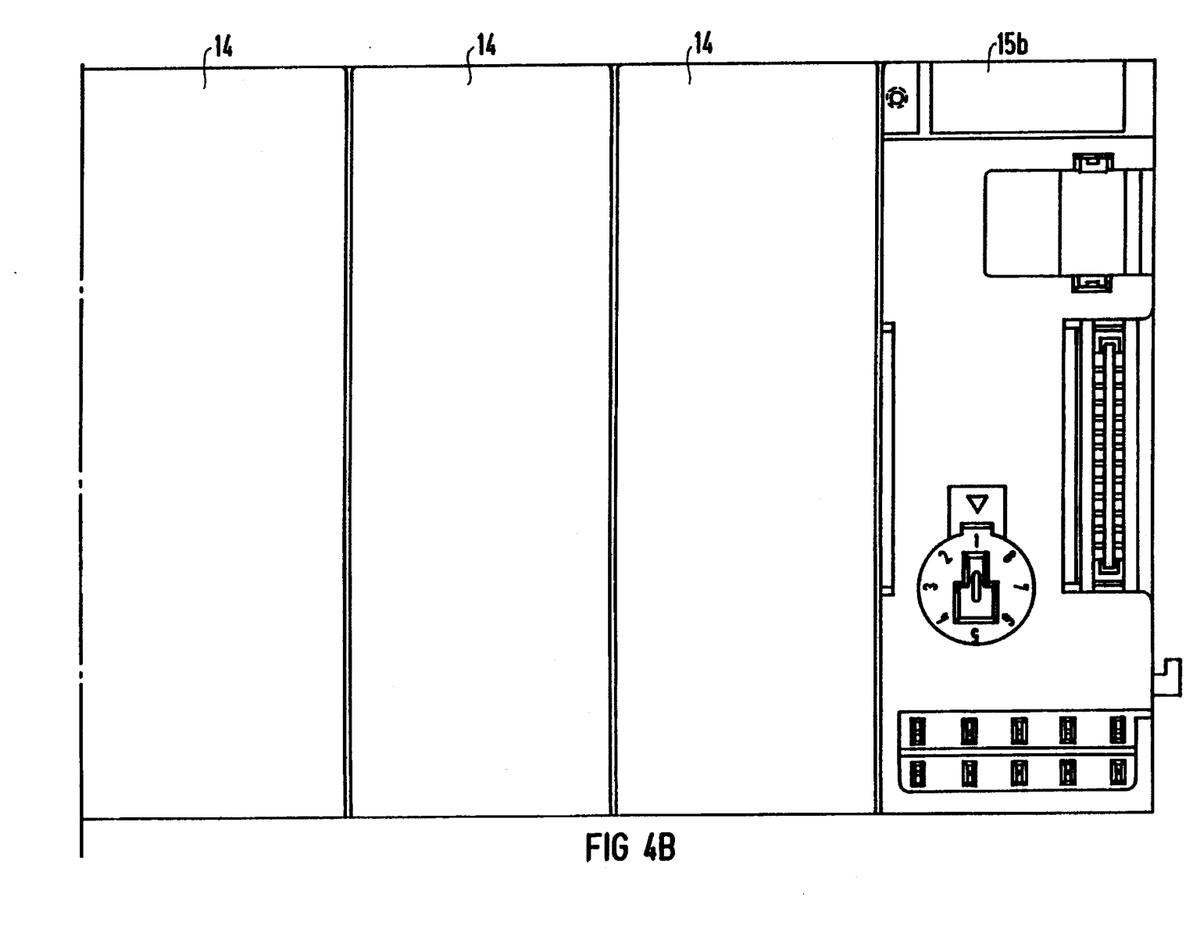
Figures 5, 5A:
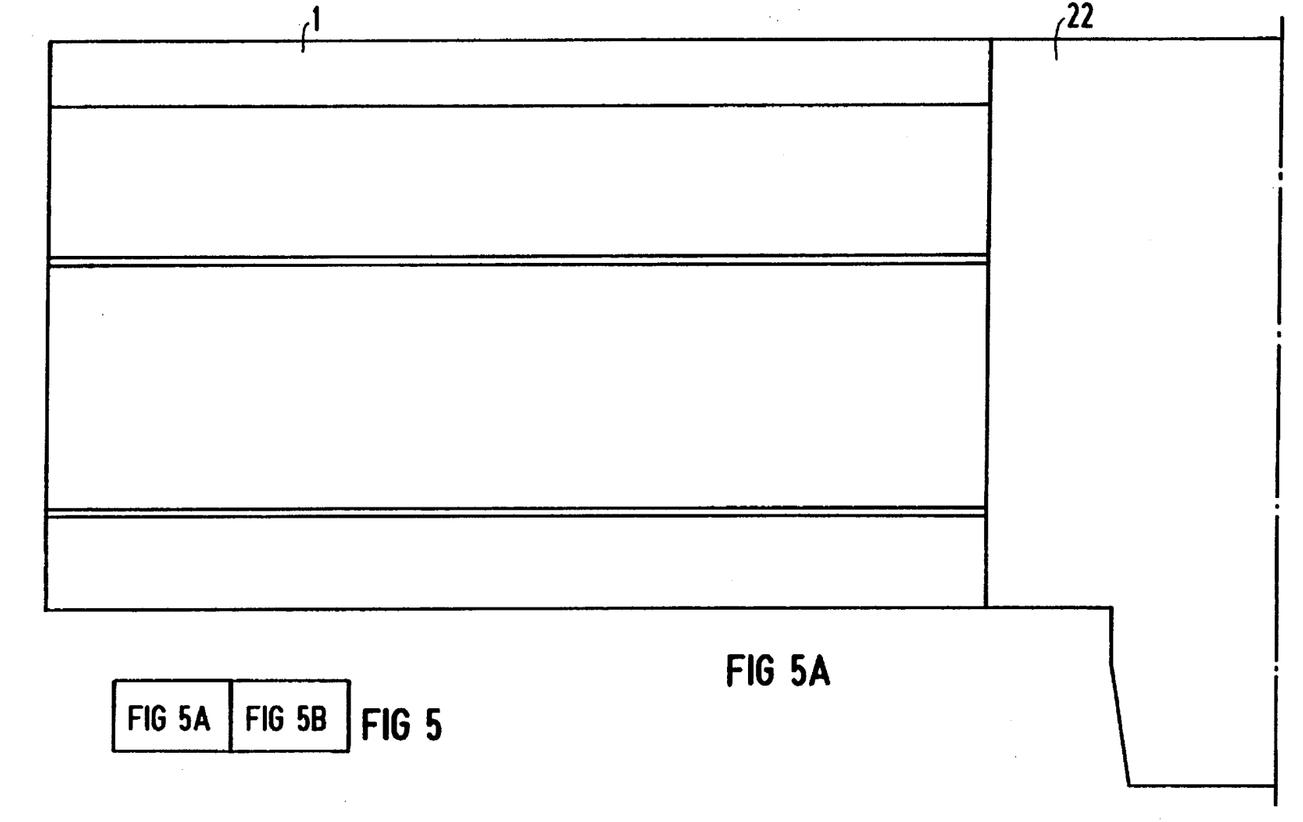
FIG. 5 depicts the layout of FIGS. 5A and 5B.
FIGS. 5A and 5B depict the top view of the programmable controller with expansion units.
Figure 5B:
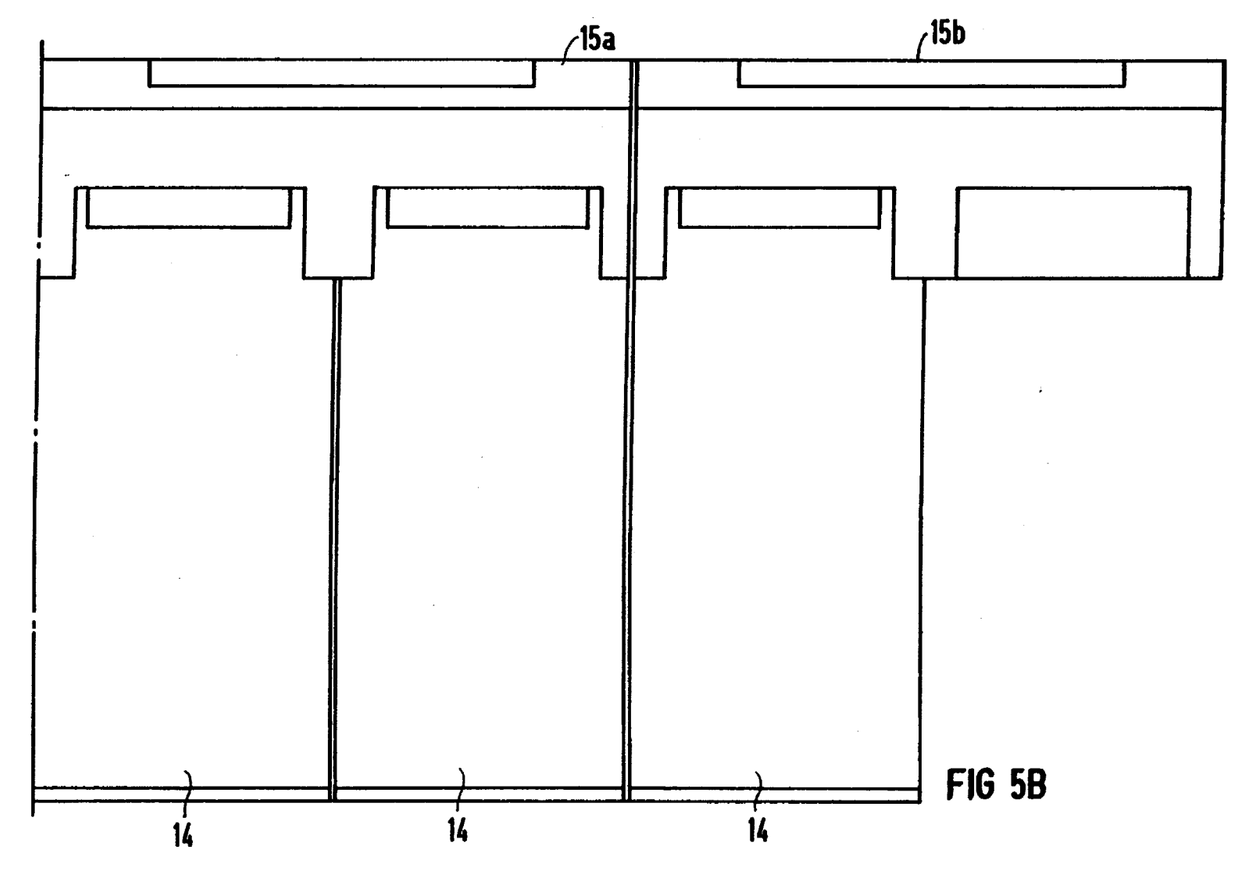

As FIGS. 4 and 5 show, whereby FIG. 5 is drawn very schematically, to expand the programmable controller 1, the interface module 22 is snapped to the right of the programmable controller 1, and the modular mounting racks 15a, 15b are snapped to the right of the interface module 22 on to a top-hat rail (not shown). The mounting racks 15a, 15b are connected to one another via a plug-in connection and a ribbon cable. The mounting rack 15a, which is arranged adjacent to the interface module 22, is connected to the plug-in connection 13 of the interface module 22. The socket 24 of the interface module 22 is connected to the plug-in connection 7 of the programmable controller 1. In this manner, dam exchange between the programmable controller 1 and the hardware modules 14, which are pivoted into the mounting racks 15a, 15b, is possible.

Since the hardware modules 14 used as expansion modules are from a modular automation system, which is already on the market, no development costs are incurred for the expansion modules 14. However, since the programmable controller 1 is already capable of stand-alone operation, the minimal configuration required for the new automation system also remains cost-effective. To minimize the costs for the programmable controller 1, the interface module 22 has connections 11 and 12, through which the interface module 22 and the expansion modules 14 are supplied with current. Analogous to the connections 9 of the programmable controller 1, the connections 11 again represent a 24 V direct voltage source, and the connections 12 represent mains connection for 230 or 115 volts.

The arrangement of the present invention results in a previously unachieved flexibility and cost efficiency. For small automation tasks, the user can just use the compact unit 1, for example. When expanding the scope of automation is later desired, the expansion modules 14 can be connected via the interface module 22 to the compact unit 1. This is very cost-effective. Later, expanding the scope of automation is again desired, the capacity of the compact unit 1 might be too small. If this is the case, the compact unit 1, together with the interface module 22, may be exchanged for the central processing unit of the modular programmable controller. Other expansion modules 14 may be then added due to the higher computing power of the central processing unit. The previously used expansion modules 14, however, can still be employed.

In conclusion, it should be pointed out that, of course, it is also possible, when the interface 7 of the programmable controller 1 is designed accordingly, for the expansion units 14 to be connected directly to the programmable controller 1, thus without the interface module 22. In this case as well, the connection is advantageously made via a multicore, flexible cable, for example a ribbon cable.

What is claimed is:

1. An expandable automation system, comprising:
   a) a programmable controller capable of stand-alone operation, and having an interface; and
   b) a modular programmable controller including a central processing unit and a plurality of expansion modules, wherein said interface is connectable to said plurality of expansion modules, and said plurality of expansion modules are usable as expansion units for said programmable controller.

2. The expandable automation system according to claim 1, further comprising an interface module, wherein said plurality of expansion modules are coupled to the programmable controller via said interface module.

3. The expandable automation system according to claim 2, wherein said interface module further comprises a connection for supplying power to said interface module and to said plurality of expansion modules.

4. The expandable automation system according to claim 3, further comprising a multicore flexible cable, wherein said interface module further comprises a mating interface corresponding to said interface of said programmable controller and being coupled via said multicore flexible cable to said interface module.

5. The expandable automation system according to claim 2, further comprising a multicore flexible cable, wherein said interface module further comprises a mating interface corresponding to said interface of said programmable controller and being coupled via said multicore flexible cable to said interface module.

6. The expandable automation system according to claim 1, further comprising a multicore flexible cable, wherein said interface module further comprises a mating interface corresponding to said interface of said programmable controller and being coupled via said multicore flexible cable to said interface module.

7. The expandable automation system according to claim 6, wherein said interface module further comprises a mounting support storing said mating interface and said multicore flexible cable when said mating interface and said multicore flexible cable are not in use.

8. The expandable automation system according to claim 6, wherein said mating interface comprises a socket.

9. The expandable automation system according to claim 6, wherein said multicore flexible cable comprises a ribbon cable.

10. The expandable automation system according to claim 6, wherein said interface module further comprises a pocket storing said mating interface and the said multicore flexible cable when not in use.

11. The expandable automation system according to claim 1, wherein said interface of the programmable controller comprises a multipole plug connector.

12. A programmable controller adapted for stand-alone operation, said programmable controller including an interface adapted to connect expansion units including expansion modules of a modular programmable controller.

* * * * *